US010028415B1

(12) United States Patent
Roy

(10) Patent No.: US 10,028,415 B1
(45) Date of Patent: Jul. 17, 2018

(54) ELECTRONIC EQUIPMENT DATA CENTER AND SERVER CO-LOCATION FACILITY CONFIGURATIONS AND METHOD OF USING THE SAME

(75) Inventor: Rob Roy, Las Vegas, NV (US)

(73) Assignee: Switch, Ltd., Las Vegas, NV (US)

( * ) Notice: Subject to any disclaimer, the term of this patent is extended or adjusted under 35 U.S.C. 154(b) by 991 days.

(21) Appl. No.: 13/551,415

(22) Filed: Jul. 17, 2012

Related U.S. Application Data

(63) Continuation-in-part of application No. 12/384,109, filed on Mar. 30, 2009, now Pat. No. 8,523,643, and a continuation-in-part of application No. 12/138,771, filed on Jun. 13, 2008.

(60) Provisional application No. 61/040,636, filed on Mar. 28, 2008, provisional application No. 60/944,082, filed on Jun. 14, 2007.

(51) Int. Cl.
*H05K 7/20* (2006.01)
(52) U.S. Cl.
CPC .................. *H05K 7/20736* (2013.01)
(58) Field of Classification Search
CPC ............................................. H05K 7/20
USPC .................................. 454/184, 187
See application file for complete search history.

(56) References Cited

U.S. PATENT DOCUMENTS

| | | | |
|---|---|---|---|
| 2,330,769 A | 9/1943 | Wichner | |
| 3,192,306 A | 6/1965 | Skonnord | |
| 3,202,580 A | 8/1965 | Bell | |
| 3,513,326 A | 5/1970 | Potts | |
| 3,840,124 A * | 10/1974 | Atwater | 211/182 |
| 3,985,957 A | 10/1976 | Torn | |
| 4,028,293 A | 6/1977 | Van Den Berg | |
| 4,102,463 A | 7/1978 | Schmidt | |
| 4,118,608 A | 10/1978 | Kussy | |
| 4,171,029 A | 10/1979 | Beale | |
| 4,189,990 A | 2/1980 | Kittler | |
| 4,233,858 A | 11/1980 | Rowlett | |
| 4,320,261 A * | 3/1982 | Scerbo et al. | 361/829 |
| 4,434,390 A * | 2/1984 | Elms | 318/473 |
| 4,453,117 A * | 6/1984 | Elms et al. | 318/778 |
| 4,456,867 A * | 6/1984 | Mallick et al. | 318/778 |
| 4,461,986 A * | 7/1984 | Maynard et al. | 318/728 |
| 4,467,260 A * | 8/1984 | Mallick et al. | 318/800 |
| 4,476,423 A * | 10/1984 | Mallick et al. | 318/800 |
| 4,548,164 A | 10/1985 | Ylonen et al. | |
| 4,663,911 A | 5/1987 | Gracia | |
| 4,797,783 A * | 1/1989 | Kohmoto | H05K 7/20572 361/688 |
| 4,996,909 A | 3/1991 | Vache et al. | |

(Continued)

OTHER PUBLICATIONS

Complaint, "*Switch v. Aligned Data Centers*", 2017, U.S District Court for the Eastern District of Texas, Marshall Division (Civil Action No. 2:17-CV-574-JRG). Litigation concerning U.S. Pat. No. 9,622,389 with invalidity allegation based on U.S. Pat. No. 8,636,565 (US2008/0055850).

*Primary Examiner* — Steven B McAllister
*Assistant Examiner* — Samantha Miller
(74) *Attorney, Agent, or Firm* — Weide & Miller, Ltd.

(57) ABSTRACT

Described herein is an integrated data center that provides for efficient cooling, as well as efficient wire routing, and in particular a configuration in which electronic equipment cabinets are arranged in rows within thermal compartments where the cabinets may be rolled in and out of place as required and a frame supports thermal shields of the thermal compartment.

12 Claims, 5 Drawing Sheets

(56) References Cited

U.S. PATENT DOCUMENTS

| | | | |
|---|---|---|---|
| 5,003,867 A | 4/1991 | Sodec et al. | |
| 5,237,484 A * | 8/1993 | Ferchau | G06F 1/20 165/80.3 |
| 5,271,585 A * | 12/1993 | Zetena, Jr. | 248/49 |
| 5,312,296 A | 5/1994 | Aalto et al. | |
| 5,322,646 A | 6/1994 | Wright et al. | |
| 5,438,781 A | 8/1995 | Landmann | |
| 5,473,114 A | 12/1995 | Vogel | |
| 5,544,012 A * | 8/1996 | Koike | H05K 7/20572 165/122 |
| 5,570,740 A | 11/1996 | Flores et al. | |
| 5,657,641 A | 8/1997 | Cunningham et al. | |
| 5,769,365 A * | 6/1998 | Onishi et al. | 248/49 |
| 5,784,847 A | 7/1998 | Wiklund | |
| 5,852,904 A * | 12/1998 | Yu et al. | 52/220.7 |
| 5,880,544 A | 3/1999 | Ikeda | |
| 5,885,154 A | 3/1999 | Napadow et al. | |
| 5,941,767 A | 8/1999 | Fukuda et al. | |
| 5,969,292 A | 10/1999 | Snider et al. | |
| 6,034,873 A * | 3/2000 | Ståhl et al. | 361/701 |
| 6,129,316 A * | 10/2000 | Bauer | 248/68.1 |
| 6,150,736 A | 11/2000 | Brill | |
| 6,224,016 B1 | 5/2001 | Lee et al. | |
| 6,231,704 B1 | 5/2001 | Carpinetti | |
| 6,365,830 B1 * | 4/2002 | Snider et al. | 174/484 |
| 6,374,627 B1 | 4/2002 | Schumacher | |
| 6,394,398 B1 * | 5/2002 | Reed et al. | 248/57 |
| 6,407,533 B1 | 6/2002 | Bartek et al. | |
| 6,412,260 B1 | 7/2002 | Lukac | |
| 6,412,292 B2 | 7/2002 | Spinazzola et al. | |
| 6,427,454 B1 | 8/2002 | West | |
| 6,437,243 B1 * | 8/2002 | VanderVelde et al. | 174/68.3 |
| 6,453,055 B1 | 9/2002 | Fukumura et al. | |
| 6,481,527 B1 | 11/2002 | French et al. | |
| 6,506,110 B1 | 1/2003 | Borisch | |
| 6,535,382 B2 | 3/2003 | Bishop et al. | |
| 6,541,704 B1 * | 4/2003 | Levenson et al. | 174/72 A |
| 6,566,775 B1 | 5/2003 | Fradella | |
| 6,567,769 B2 | 5/2003 | Chang | |
| 6,574,970 B2 | 6/2003 | Spinazzola et al. | |
| 6,592,448 B1 | 7/2003 | Williams | |
| 6,616,524 B2 | 9/2003 | Storck et al. | |
| 6,707,688 B2 * | 3/2004 | Reyes et al. | 361/824 |
| 6,722,151 B2 | 4/2004 | Spinazzola et al. | |
| 6,742,942 B2 | 6/2004 | Hering et al. | |
| 6,745,579 B2 | 6/2004 | Spinazzola et al. | |
| 6,794,777 B1 | 9/2004 | Fradella | |
| 6,817,688 B2 | 11/2004 | O'Halloran | |
| 6,822,859 B2 | 11/2004 | Coglitore et al. | |
| 6,846,132 B2 | 1/2005 | Kennedy et al. | |
| 6,848,267 B2 | 2/2005 | Pierson | |
| 6,859,366 B2 | 2/2005 | Fink | |
| 6,862,179 B2 | 3/2005 | Beitelmal et al. | |
| 6,867,967 B2 | 3/2005 | Mok | |
| 6,897,587 B2 | 5/2005 | McMillen | |
| 6,957,670 B1 | 10/2005 | Kajino | |
| 6,967,283 B2 * | 11/2005 | Rasmussen et al. | 174/50 |
| 6,981,915 B2 | 1/2006 | Moore et al. | |
| 7,003,374 B2 | 2/2006 | Olin et al. | |
| 7,033,267 B2 | 4/2006 | Rasmussen et al. | |
| 7,042,722 B2 * | 5/2006 | Suzuki et al. | 361/695 |
| 7,061,715 B2 | 6/2006 | Miyamoto | |
| 7,100,827 B2 | 9/2006 | Olin et al. | |
| 7,128,138 B2 | 10/2006 | Des Champs | |
| 7,187,265 B1 | 3/2007 | Senogles et al. | |
| 7,232,236 B2 | 6/2007 | Vitense et al. | |
| 7,315,448 B1 | 1/2008 | Bash et al. | |
| 7,369,741 B2 | 5/2008 | Reagan et al. | |
| 7,372,695 B2 | 5/2008 | Coglitore | |
| 7,430,118 B1 | 9/2008 | Noteboom et al. | |
| 7,448,945 B2 | 11/2008 | Bessent | |
| 7,477,514 B2 | 1/2009 | Campbell et al. | |
| 7,486,511 B1 | 2/2009 | Griffel et al. | |
| 7,500,911 B2 | 3/2009 | Johnson et al. | |
| 7,505,849 B2 | 3/2009 | Saarikivi | |
| 7,508,663 B2 | 3/2009 | Coglitore et al. | |
| 7,542,287 B2 | 6/2009 | Lewis et al. | |
| 7,604,535 B2 | 10/2009 | Germagian et al. | |
| 7,641,546 B2 | 1/2010 | Bok et al. | |
| 7,643,291 B2 | 1/2010 | Mallia et al. | |
| 7,656,660 B2 | 2/2010 | Hoeft | |
| 7,667,965 B2 | 2/2010 | Nobile | |
| 7,675,747 B1 | 3/2010 | Ong et al. | |
| 7,684,193 B2 | 3/2010 | Fink et al. | |
| 7,688,578 B2 | 3/2010 | Mann et al. | |
| 7,716,829 B2 | 5/2010 | Des Champs et al. | |
| 7,778,030 B1 | 8/2010 | Chiriac | |
| 7,787,260 B2 | 8/2010 | Hruby et al. | |
| 7,789,359 B2 | 9/2010 | Chopp et al. | |
| 7,804,685 B2 | 9/2010 | Krietzman | |
| 7,804,690 B2 | 9/2010 | Huang et al. | |
| 7,862,410 B2 | 1/2011 | McMahan et al. | |
| 7,894,190 B2 | 2/2011 | Davis et al. | |
| 7,903,407 B2 | 3/2011 | Matsushima et al. | |
| 7,954,070 B2 | 5/2011 | Plocher et al. | |
| 7,957,139 B2 | 6/2011 | Davis et al. | |
| 7,971,446 B2 | 7/2011 | Clidaras | |
| 8,037,644 B2 | 10/2011 | Hall | |
| 8,040,673 B2 | 10/2011 | Kreitzman | |
| 8,072,780 B1 | 12/2011 | Roy | |
| 8,113,010 B2 | 2/2012 | Carlson | |
| 8,144,467 B2 | 3/2012 | Campbell et al. | |
| 8,180,495 B1 | 5/2012 | Roy | |
| 8,209,056 B2 | 6/2012 | Rasmussen et al. | |
| 8,209,993 B2 | 7/2012 | Carlson et al. | |
| 8,223,495 B1 | 7/2012 | Carlson et al. | |
| 8,257,155 B2 | 9/2012 | Lewis | |
| 8,282,451 B2 | 10/2012 | Taylor | |
| 8,300,410 B2 * | 10/2012 | Slessman | 361/691 |
| 8,310,832 B2 | 11/2012 | Vanderveen et al. | |
| 8,346,398 B2 | 1/2013 | Ahmend et al. | |
| 8,509,960 B2 | 8/2013 | Tai et al. | |
| 8,574,046 B2 | 11/2013 | Nishiyama et al. | |
| 8,583,290 B2 | 11/2013 | Campbell et al. | |
| 8,601,827 B2 | 12/2013 | Keisling et al. | |
| 8,636,565 B2 | 1/2014 | Carlson et al. | |
| 8,782,234 B2 | 7/2014 | Pienta et al. | |
| 8,806,238 B2 | 8/2014 | Jau | |
| 8,853,872 B2 | 10/2014 | Clidaras et al. | |
| 9,021,821 B2 | 5/2015 | Dunnavant | |
| 9,032,742 B2 | 5/2015 | Dunnavant | |
| 9,055,696 B2 | 6/2015 | Dunnavant | |
| 9,104,387 B1 | 8/2015 | Eichelberg | |
| 9,119,326 B2 | 8/2015 | McDonnell et al. | |
| 9,121,618 B2 | 9/2015 | Fisher et al. | |
| 9,204,578 B2 | 12/2015 | Smith | |
| 9,282,684 B2 | 3/2016 | Keisling et al. | |
| 9,591,790 B2 | 3/2017 | Eichelberg | |
| 9,606,588 B2 | 3/2017 | Dean et al. | |
| 9,629,285 B1 | 4/2017 | Lachapelle et al. | |
| 9,648,784 B2 | 5/2017 | Keisling et al. | |
| 9,867,318 B2 | 1/2018 | Eichelberg | |
| 9,877,414 B2 | 1/2018 | Vorreiter | |
| 2001/0029163 A1 | 10/2001 | Spinazzola et al. | |
| 2002/0005457 A1 | 1/2002 | Lee et al. | |
| 2002/0059804 A1 | 5/2002 | Spinazzola et al. | |
| 2002/0108386 A1 | 8/2002 | Spinazzola et al. | |
| 2002/0121555 A1 | 9/2002 | Cipolla et al. | |
| 2003/0050003 A1 | 3/2003 | Charron | |
| 2003/0122379 A1 | 7/2003 | Woods | |
| 2003/0124971 A1 | 7/2003 | Williams | |
| 2003/0143942 A1 | 7/2003 | Kennedy et al. | |
| 2003/0181158 A1 | 9/2003 | Schell et al. | |
| 2003/0183955 A1 | 10/2003 | Fields | |
| 2003/0231881 A1 | 12/2003 | Hering et al. | |
| 2004/0004813 A1 | 1/2004 | Coglitore | |
| 2004/0099747 A1 | 5/2004 | Johnson et al. | |
| 2004/0118137 A1 | 6/2004 | Patel et al. | |
| 2004/0148934 A1 | 8/2004 | Pinkerton | |
| 2004/0218355 A1 | 11/2004 | Bash | |
| 2005/0034468 A1 | 2/2005 | Dietz | |
| 2005/0099770 A1 | 5/2005 | Fink | |
| 2005/0167135 A1 * | 8/2005 | Jackson | 174/50 |
| 2005/0170770 A1 | 8/2005 | Johnson et al. | |

(56) References Cited

U.S. PATENT DOCUMENTS

| | | |
|---|---|---|
| 2005/0185363 A1* | 8/2005 | Rasmussen et al. ......... 361/624 |
| 2005/0225936 A1 | 10/2005 | Day |
| 2005/0245132 A1 | 11/2005 | Olin et al. |
| 2005/0246057 A1 | 11/2005 | Olin et al. |
| 2005/0278070 A1 | 12/2005 | Bash et al. |
| 2006/0021786 A1 | 2/2006 | Fetterolf |
| 2006/0026954 A1 | 2/2006 | Truong |
| 2006/0055175 A1 | 3/2006 | Grinblat |
| 2006/0056127 A1 | 3/2006 | Lewis |
| 2006/0066163 A1 | 3/2006 | Melfi |
| 2006/0072277 A1* | 4/2006 | Schmidt et al. ............. 361/119 |
| 2006/0082263 A1 | 4/2006 | Rimler et al. |
| 2006/0146520 A1 | 7/2006 | Vitense et al. |
| 2006/0158037 A1 | 7/2006 | Danley |
| 2006/0185931 A1 | 8/2006 | Kawar |
| 2006/0187636 A1 | 8/2006 | Fink et al. |
| 2006/0236487 A1 | 10/2006 | Dean |
| 2006/0260338 A1 | 11/2006 | VanGilder et al. |
| 2006/0276121 A1 | 12/2006 | Rasmussen et al. |
| 2006/0277501 A1 | 12/2006 | Plocher et al. |
| 2006/0281061 A1 | 12/2006 | Hightower |
| 2007/0021050 A1 | 1/2007 | Kennedy |
| 2007/0032979 A1 | 2/2007 | Hamann et al. |
| 2007/0040263 A1 | 2/2007 | Towada |
| 2007/0064389 A1 | 3/2007 | Lewis, II et al. |
| 2007/0078635 A1 | 4/2007 | Rasmussen et al. |
| 2007/0082195 A1 | 4/2007 | Goecke et al. |
| 2007/0129000 A1 | 6/2007 | Rasmussen et al. |
| 2007/0135032 A1 | 6/2007 | Wang |
| 2007/0171613 A1 | 7/2007 | McMahan et al. |
| 2007/0211443 A1 | 9/2007 | Wechter et al. |
| 2007/0243425 A1 | 10/2007 | Spaner |
| 2007/0253181 A1 | 11/2007 | Bersiek |
| 2007/0267247 A1 | 11/2007 | Tartsch |
| 2008/0029250 A1 | 2/2008 | Carlson et al. |
| 2008/0035810 A1 | 2/2008 | Lewis |
| 2008/0055848 A1 | 3/2008 | Hamburgen et al. |
| 2008/0055850 A1 | 3/2008 | Carlson et al. |
| 2008/0137266 A1 | 6/2008 | Jensen |
| 2008/0264688 A1 | 10/2008 | Chopp et al. |
| 2008/0299890 A1 | 12/2008 | Orrell |
| 2008/0305733 A1 | 12/2008 | Noteboom |
| 2009/0051545 A1 | 2/2009 | Koblasz |
| 2009/0061756 A1 | 3/2009 | Germagian |
| 2009/0064551 A1 | 3/2009 | Schroder et al. |
| 2009/0195977 A1 | 8/2009 | Fink et al. |
| 2009/0197684 A1 | 8/2009 | Arezina et al. |
| 2009/0228726 A1 | 9/2009 | Malik |
| 2009/0229510 A1 | 9/2009 | Sutter |
| 2009/0235097 A1 | 9/2009 | Hamilton |
| 2009/0239460 A1 | 9/2009 | Lucia et al. |
| 2009/0239461 A1 | 9/2009 | Lewis et al. |
| 2009/0277605 A1 | 11/2009 | Vangilder et al. |
| 2009/0308579 A1 | 12/2009 | Johnson et al. |
| 2009/0319650 A1 | 12/2009 | Collins |
| 2010/0003911 A1 | 1/2010 | Graczyk et al. |
| 2010/0016730 A1 | 1/2010 | Tanaka et al. |
| 2010/0048119 A1 | 2/2010 | Tashiro |
| 2010/0061059 A1 | 3/2010 | Krietzman et al. |
| 2010/0144265 A1 | 6/2010 | Bednarcik et al. |
| 2010/0151781 A1 | 6/2010 | Slessman et al. |
| 2010/0187832 A1 | 7/2010 | Holland |
| 2010/0190430 A1 | 7/2010 | Rodrigues et al. |
| 2010/0201230 A1 | 8/2010 | Schweitzer et al. |
| 2010/0216388 A1 | 8/2010 | Tresh et al. |
| 2010/0223800 A1 | 9/2010 | Morrison et al. |
| 2010/0245083 A1 | 9/2010 | Lewis |
| 2010/0248609 A1 | 9/2010 | Tresh et al. |
| 2010/0248610 A1 | 9/2010 | Caveney et al. |
| 2010/0267325 A1 | 10/2010 | Matser et al. |
| 2010/0304657 A1 | 12/2010 | Gallmann et al. |
| 2010/0328889 A1 | 12/2010 | Campbell et al. |
| 2011/0009047 A1 | 1/2011 | Noteboom et al. |
| 2011/0014862 A1 | 1/2011 | Honold et al. |
| 2011/0031071 A1 | 2/2011 | Takeuchi |
| 2011/0078480 A1 | 3/2011 | Calo et al. |
| 2011/0105010 A1 | 5/2011 | Day |
| 2011/0122570 A1 | 5/2011 | Beck et al. |
| 2011/0143644 A1 | 6/2011 | McMahan et al. |
| 2011/0156480 A1 | 6/2011 | Park |
| 2012/0041569 A1 | 2/2012 | Zhang |
| 2012/0331317 A1 | 12/2012 | Rogers |

* cited by examiner

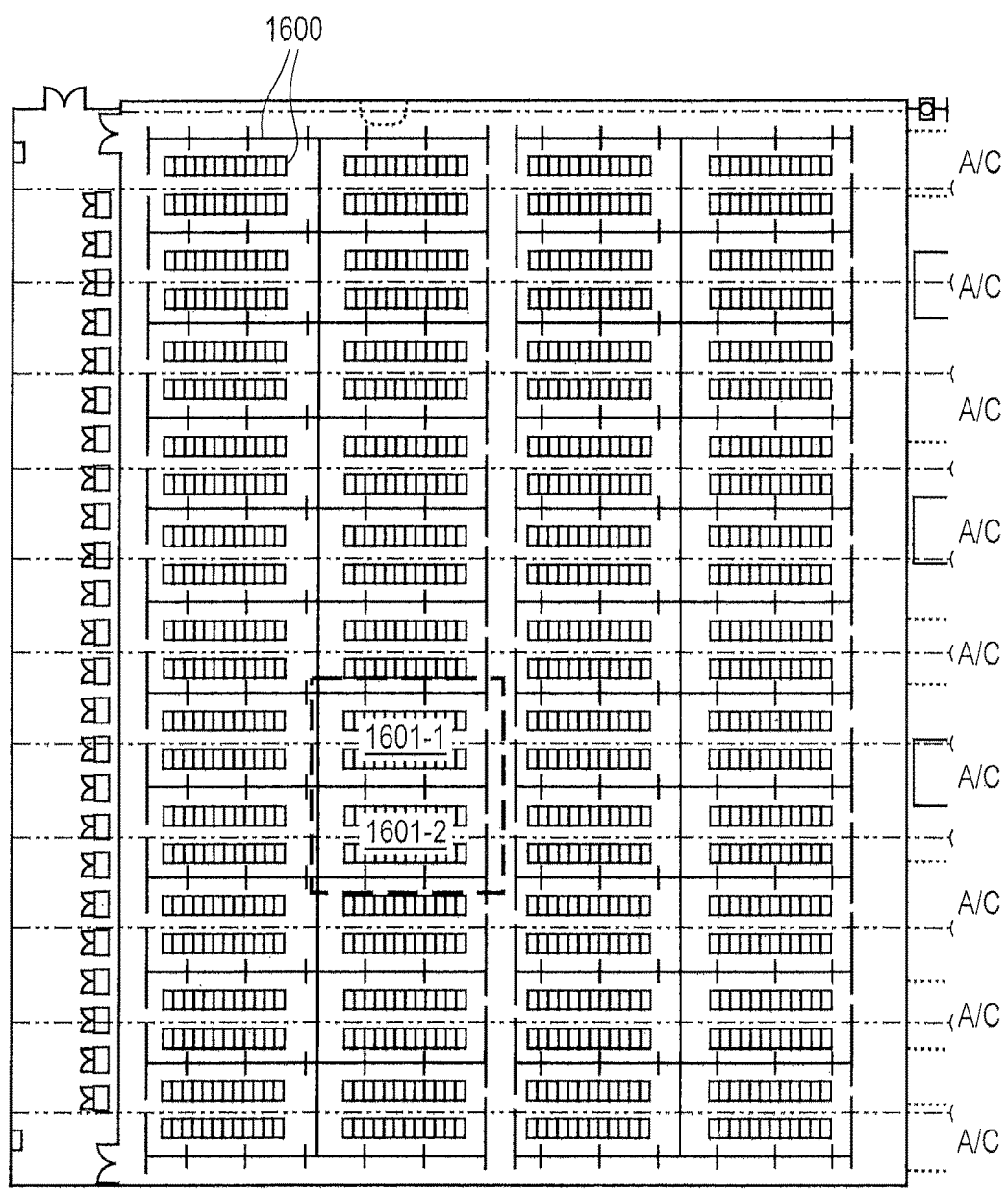
FIG. 1A1

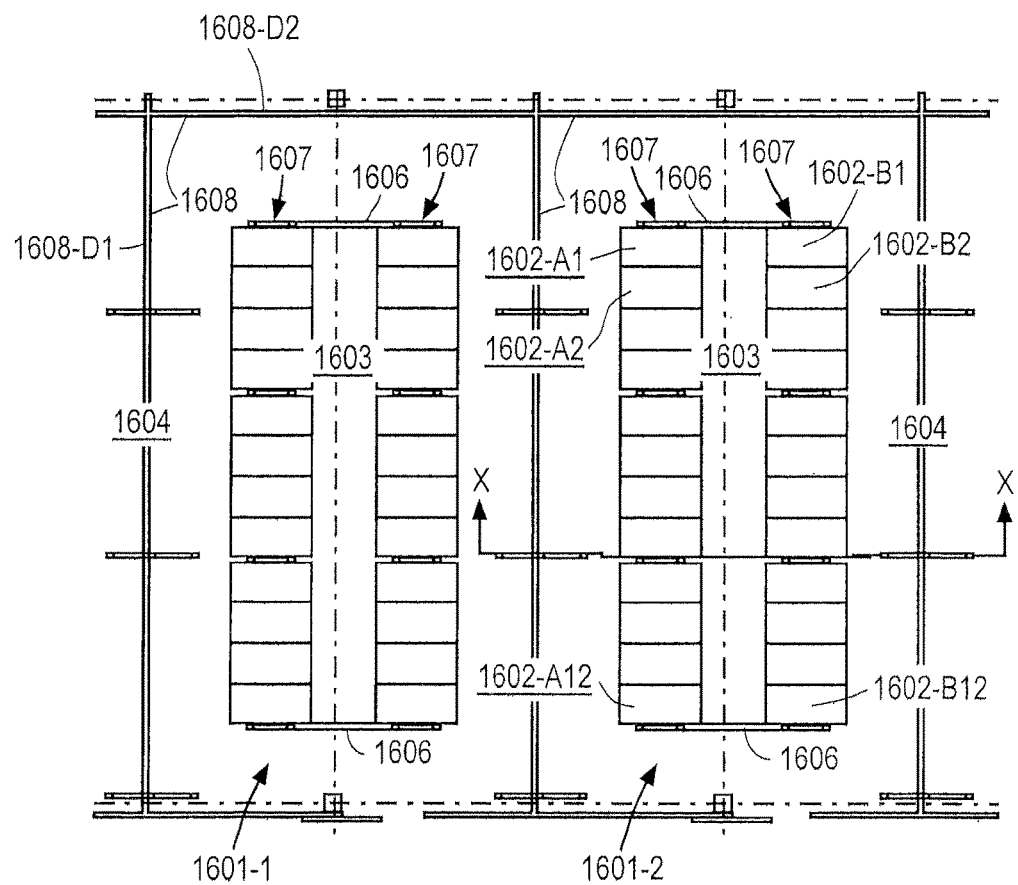
FIG. 1A2

ELECTRONIC EQUIPMENT DATA CENTER AND SERVER CO-LOCATION FACILITY CONFIGURATIONS AND METHOD OF USING THE SAME

This application is a continuation-in-part of and claims priority to U.S. Utility application Ser. No. 12/384,109 entitled "Electronic Equipment Data Center or Co-location Facility Designs and Methods of Making and Using the Same" filed on Mar. 30, 2009, which application claims priority to U.S. Provisional Application No. 61/040,636 entitled "Electronic Equipment Data Center or Co-Location Facility Designs and Methods of Making and Using the Same," filed on Mar. 28, 2008, and is also a continuation-in-part and claims priority to U.S. Utility application Ser. No. 12/138,771 entitled "Electronic Equipment Data Center or Co-location Facility Designs and Methods of Making and Using the Same" filed Jun. 13, 2008, which application claims priority to U.S. Provisional Application Ser. No. 60/944,082 entitled "Electronic Equipment Data Center or Co-location Facility Designs and Methods of Making and Using the Same" filed Jun. 14, 2007, which applications are expressly incorporated by reference herein.

BACKGROUND

Field of the Related Art

A cabinet cluster support structure for an electronic equipment data center or co-location facility design is described.

Background

Data centers and server co-location facilities are well-known. In such facilities, rows of electronics equipment, such as servers, typically owned by different entities, are stored. In many facilities, cabinets are used in which different electronics equipment is stored, so that only the owners of that equipment, and potentially the facility operator, have access therein. In many instances, the owner of the facilities manages the installation and removal of servers within the facility, and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

There are some well-known common aspects to the designs of these facilities. For example, it is known to have the electronic equipment placed into rows, and further to have parallel rows of equipment configured back-to back so that each row of equipment generally forces the heat from the electronic equipment toward a similar area, known as a hot aisle, as that aisle generally contains warmer air that results from the forced heat from the electronics equipment. In the front of the equipment is thus established a cold aisle.

There are different systems for attempting to collect hot air that results from the electronics equipment, cooling that hot air, and then introducing cool air to the electronics equipment. These air-conditioning systems also must co-exist with power and communications wiring for the electronics equipment. Systems in which the electronics equipment is raised above the floor are well-known, as installing the communications wiring from below the electronics equipment has been perceived to offer certain advantages. Routing wiring without raised floors is also known—though not with systematic separation of power and data as described herein.

In the air conditioning units that are used in conventional facility systems, there are both an evaporator unit and a condenser unit. The evaporator units are typically located inside a facility and the condenser units are typically disposed outside of the facility. These units, however, are not located in standardized, accessible and relatively convenient positions relative to the facility should any of the units need to be accessed and/or removed for repair or replacement. Further, these units are not themselves created using an intentionally transportable design.

In conventional facilities, wiring for electrical power and cabling for data is typically routed in an ad-hoc manner. More recently, systems for a more uniform system of wiring have been proposed. Nonetheless, there is still needed an apparatus that can provide for local wiring within a cabinet cluster, as well as for wiring that must be routed to different clusters from a distribution area. Still furthermore, there is the need for an apparatus that can provide for the wiring referred to above, as well as the support for a thermal shield that can create a physical partition to assist with thermal gradients that are desirable within a cabinet cluster.

SUMMARY

Described are embodiments for an integrated data center that provides for efficient cooling, as well as efficient wire routing.

In one aspect is described an apparatus for maintaining a configuration of electronic equipment disposed in a plurality of cabinets, for supporting a thermal shield that defines a hot air containment chamber, for supporting a thermal barrier ceiling, for supporting cool air ductwork and for supporting distribution power wires and conduits, electronic equipment power wires and conduits, and communication wiring, the plurality of cabinets disposed on a floor, the floor being within an internal area of a building, the cabinets positioned into two rows that are separated by a hot aisle area so that the electronic equipment disposed in the plurality of cabinets emit heated air in a predetermined direction toward the hot aisle area between the two rows, the apparatus comprising: an interior frame structure that is independent of and not structurally tied to the plurality of cabinets, the interior frame structure including: a first plurality of vertical support brackets disposed along each of the two rows, each vertical support bracket being disposed on the floor at one end and assists in supporting the thermal barrier ceiling at another end, wherein the first plurality of vertical support brackets each further support portions of the thermal shield on one side of the first plurality of vertical support brackets at a location above a top of the plurality of cabinets: a plurality of tiered ladder rack supports, each connected to another side of at least some of the first plurality of vertical support brackets that is opposite the one side, which establish a plurality of different tiers outside of the hot air containment chamber, so that each of the different tiers is adapted to hold the electronic equipment power wires and conduits and the communication wiring, and a plurality of conduit holders for holding a plurality of the distribution power wires and conduits, each of the plurality of conduit holders connected to another side of at least some of the first plurality of vertical support brackets that is opposite the one side, each of the plurality of conduit holder disposed above the plurality of tiered ladder rack supports, each of the plurality of conduit holders being aligned with other ones of the plurality of conduit holders; and a second plurality of vertical support brackets disposed in a row, substantially parallel to the two rows, each second vertical support bracket being disposed on the floor at one end and assists in supporting the thermal barrier ceiling at another end, wherein the second plurality of vertical support brackets each further support portions of the cool air ductwork.

In another aspect is described a method of configuring a plurality of cabinets having electronic equipment stored therein in building having exterior walls and cool air ductwork comprising the steps of: providing a building have exterior walls, a floor, a roof with a ceiling below, and an interior room; within the interior room of the building, providing an interior frame structure, the interior frame structure including a plurality of cabinet clusters, each cabinet cluster including a first plurality of vertical support brackets disposed along each of the two rows, each vertical support bracket being disposed on the floor at one end, some of the vertical brackets assisting in supporting (1) a portion of a thermal barrier ceiling at another end, the thermal barrier ceiling being disposed below the ceiling and creating an airspace between the ceiling and the thermal barrier ceiling, and (2) a hot containment chamber, the hot containment chamber being contiguous with the thermal barrier ceiling and providing an opening into the airspace, with a sealed chamber through which warm air rises within a hot air aisle associated with the cabinet cluster; and a second plurality of vertical support brackets disposed in a row, substantially parallel to the two rows, each second vertical support bracket being disposed on the floor at one end and assists in supporting another portion of the thermal barrier ceiling at another end, wherein the second plurality of vertical support brackets each further support portions of the cool air ductwork below the thermal barrier ceiling; providing a plurality of cabinets, the plurality of cabinets being disposed in two rows, below and adjacent to the hot containment chamber, thereby creating the hot aisle between the two rows; providing a thermal cabinet panels in an opening within the two rows where the plurality of cabinets are disposed to seal the hot aisle; and providing a thermal partition at each of two ends of the two rows to further seal the hot aisle.

BRIEF DESCRIPTION OF THE DRAWINGS

These and other aspects and features will become apparent to those of ordinary skill in the art upon review of the following description of specific embodiments of the invention in conjunction with the accompanying figures, wherein:

FIG. 1A1-2 illustrate top views of a floor design used in the data center or co-location facility.

FIG. 2 illustrates a perspective view of part of the support frame and thermal shields of the data center of FIGS. 1A2 & 1B.

DETAILED DESCRIPTION OF THE PREFERRED EMBODIMENTS

Described are data center or co-location facility designs and methods of making and using the same. The data center or co-location facility designs have certain features that will be apparent herein and which allow many advantages in terms of efficient use of space, efficient modular structures that allow for efficiency in the set-up of co-location facility and the set-up of the electronics equipment in the facility, as well as efficient air-conditioning within the facility. Each of these features has aspects that are distinct on their own, and combinations of these features also exist that are also unique.

FIGS. 1A1-2 & 1B show different views of a portion of a data center or co-location facility.

Figure 1B:
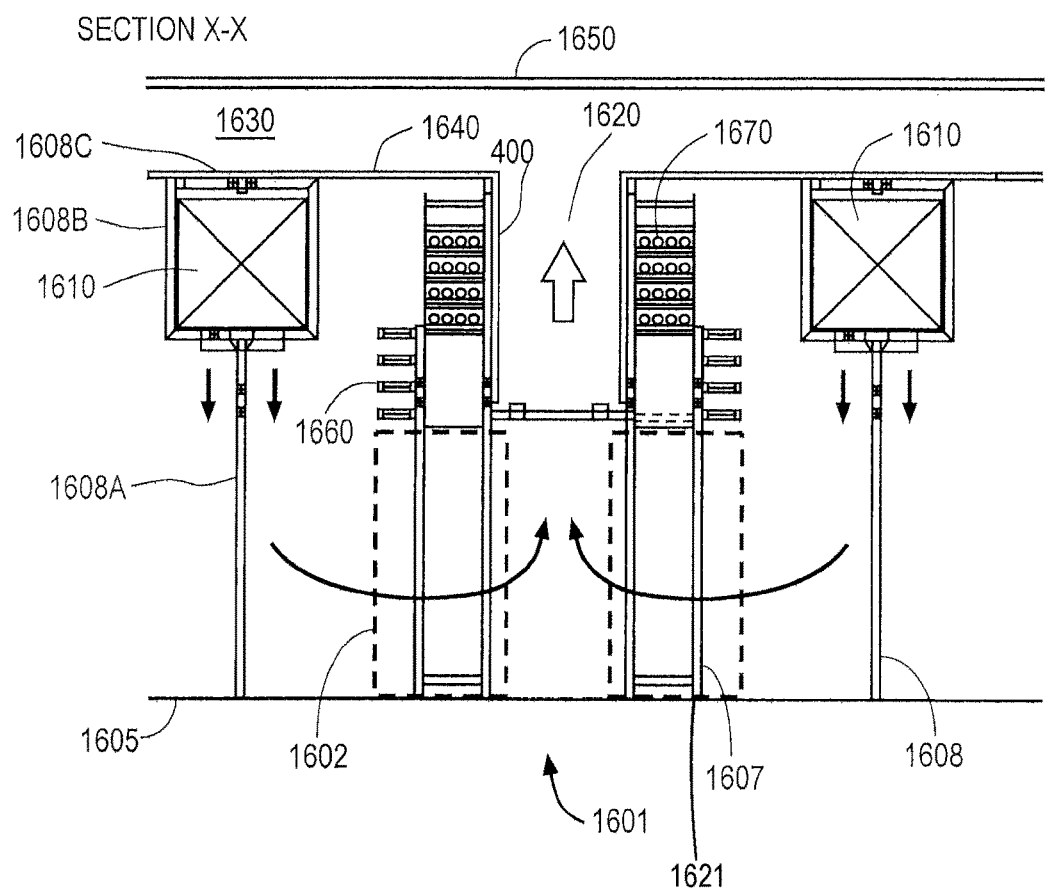
FIG. 1B illustrates a cross-sectional view along X-X from FIG. 1A2.

FIG. 1A1 shows a top view of a preferred data center floor, with an interior frame structure 1600 used to form the structures, described hereinafter, that support an array of cabinet clusters 1601, two of which are identified as 1601-1 and 1601-2, and which are then shown in further detail in FIG. 1A2. In this specific embodiment in FIG. 1A1, a 4×11 array of cabinet clusters is illustrated, though the number and shape thereof can vary, as explained further herein. It is noted that this top view also illustrates, along the entire left edge, a row of PDUs, which are internal within the data center, as well as a row of A/C units, which are external to the data center. Cool air is provided by cool-air ductwork from the external A/C units to the cabin clusters using cool-air ductwork 1610 illustrated in FIG. 1B, which ductwork preferably spans an entire row of four different cabinet clusters, as shown in this specific embodiment. As also shown in FIG. 1B, there exists a thermal barrier ceiling 1640, from which ceiling air 1630 the hot air then flows to the air handling system A/C, and there is a tight seal so that the only openings to the ceiling air 1630 are using the hot air containment chamber 162, formed as described further herein, above each hot-aisle 1604 associated with each cabinet cluster 1601.

In certain embodiments, parallel rows of equipment cabinets 1602 are arranged in clusters, and further configured so as to allow the cabinets to be rolled in and out of place as required, as well as around load-bearing posts of the interior frame structure 1600, without interference by wiring and other components. It is thus apparent that a significant aspect is that the equipment cabinets are independent of, and not structurally a part of the interior frame structure 1600, which allows for a host of advantages and efficiencies. The interior facility shown in FIGS. 1A1-2 and 1B may be integrated with the air handling systems described in U.S. Utility application Ser. No. 12/384,109 entitled "Electronic Equipment Data Center or Co-location Facility Designs and Methods of Making and Using the Same" filed on Mar. 30, 2009, incorporated by reference in full herein, wherein the condenser air conditioning units and heat expulsion chambers are either disposed within or outside the exterior walls of the facility. Furthermore, the interior facility shown in FIGS. 1A1-2 and 1B may include aspects of one or more of the cable and conduit routing system configurations as described in U.S. Utility application Ser. No. 12/384,109, and expanded upon in more detail below.

The interior facility shown in FIGS. 1A1-2 and 1B also includes a cabinet clusters 1601, each cabinet cluster 1601 configured to provide direct hot air exhaust from the electrical equipment toward the hot aisle 1603 associated therewith. Air flows in which the cool air moves efficiently through the electronic equipment cabinets 1602 into the hot aisles 1603 from where it is exhausted through a hot air containment chamber 1620 and into an upper ceiling area 1630, which is lowerly bounded by the upper surface of the thermal barrier ceiling 1640, from which ceiling air 1630 the hot air then flows to the an air handling system (A/C shown in FIG. 1A1). The air flow through the electronic equipment cabinets is configured and controlled to provide efficient cooling of the electronic equipment while also cooling the facility in an environmentally efficient manner.

Figure 2:
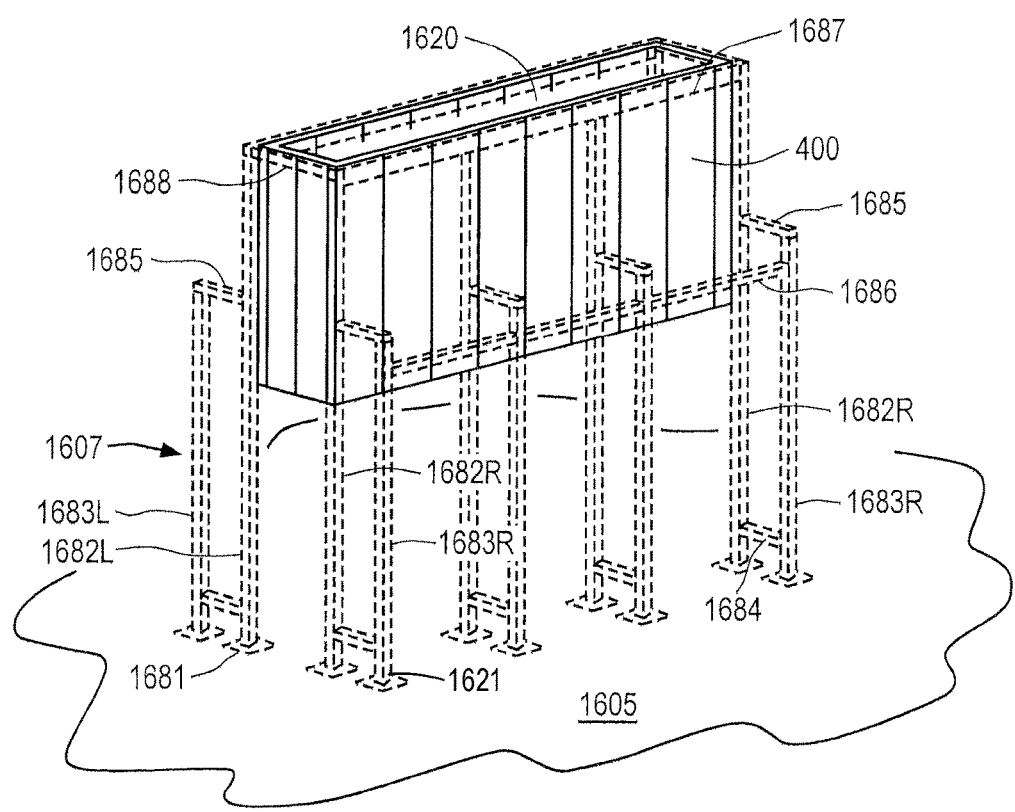

FIG. 1A2 also illustrates that the parallel rows of electronic equipment cabinets 1602 are configured on each side of a hot aisle 1603, with the electronic cabinets and equipment therein being arranged in a back-to-back configuration, such that for example, the back of cabinet 1602A1 faces the back of cabinet 1602B1. While twelve (12) cabinets 1602 per row are shown, this number is illustrative only. Further a square cabinet configuration cluster or other variants that include a hot aisle are within the intended scope of the invention.

The ends of each aisle are closed off by a solid thermal barrier partition 1606 that attaches to the support frames 1607, described further hereinafter. One of the two partitions 1606 within each cabinet cluster 1601 preferably includes a door for access to the corresponding hot aisle 1603. A row of cabinets on each side of a hot aisle forms the cabinet cluster 1601. Each cabinet cluster 1601 has a cold aisle 1604 on either side, typically shared in common with an adjacent cabinet cluster 1601.

The floor 1605 of the facility may be marked to explicitly show the various areas of the facility. For example, the center area of the hot aisle 1603 may be marked by tile, paint, tape or otherwise. The typical dimensions of the central area are typically in the range of 2'-4' across the width, with a row length corresponding to the number of electronic cabinets in the row. Marking with tiles is preferable as the marking will last, and tiles that are red in color, corresponding to the generation of heat, have been found preferable. The areas where rows of cabinets 1602 are positioned may be marked in another manner, such as using a grey tile that is different in color from the center area. Furthermore, the floor areas outside of the cabinets and hot aisle may be marked in yet a different manner, such as using a light grey tile. The placement of these markings for the different areas on the floor of the facility, preferably prior to moving any equipment onto the floor, allows for a visual correspondence on the floor of the various hot and cold aisles. In particular, when pushing cabinets into place, the cabinets will sit on a grey tile, facing a red tiled hot aisle at the back and a light grey area that is for the front of the cabinet that will face the cold aisle, hence the correct position of a cabinet will be readily apparent.

Figure 3:
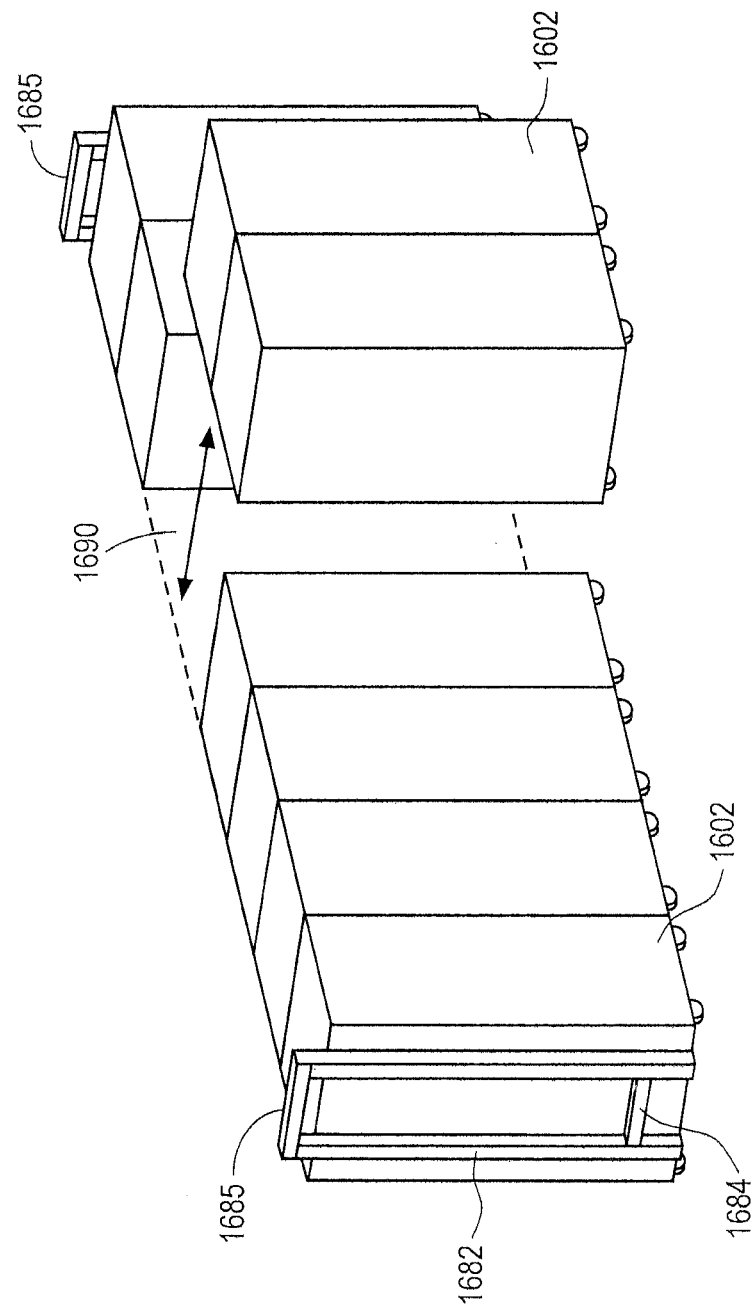
FIG. 3 illustrates a perspective view of a group of movable equipment cabinets, with one cabinet rolled out, according to embodiments.

Furthermore, FIG. 1A2 shows the interior frame structure 1600, which includes support frames 1607 for supporting the thermal barrier 400 associated with each cabinet cluster 1601, the various support racks and conduits described herein, and the thermal barrier ceiling 1640, and also support frame 1608 for supporting the cold air ducts and the thermal barrier ceiling 1640. A first end 1621 of the frames 1607 for the cabinet clusters are preferably bolted to the floor 1605 as shown in FIG. 1B and FIG. 2. In the example shown in FIG. 1A2, the frames 1607 divide up each row into three equal groups of cabinets, and include therein power and telecommunications equipment that is used to then service other electronic equipment within the cabinet cluster, as described in the applications incorporated by reference herein. (Such a group of cabinets is shown in FIG. 3.) The cold air ducts which are supported by frames 1608 that run parallel to the rows of cabinets and are also preferably bolted to the floor 1605. In a preferred embodiment, they are positioned directly above the cold aisles 1604, though other overhead positions will also work. The interior frames 1607 and frame 1608 may be made of structurally sound materials, such as steel with a welded construction of the various parts as described, molded plastic, or other materials. Further details of the frames 1607 and frame 1608 are shown in FIGS. 1B & 2.

FIG. 1B illustrates a cross-sectional view along line X-X from FIG. 1A. The figure shows floor 1605, thermal barrier ceiling 1640 and actual ceiling 1650. The thermal barrier ceiling 1640 and the actual ceiling 1650 are configured to have a gap that is preferably at least 1.5-3 feet and advantageously at least 15 feet, as the higher the ceiling the more the warm air rises (and thus also stays further away from the equipment in the cabinets 1602). The thermal barrier ceiling 1640 is preferably made of insulated tiles or panels, with a thickness of at least 1.5"-4.0". The insulation value of the tiles/panels is preferably at least an RS-R 19. These tiles/panels are held in position by the interior frame 1600, rather than being hung by a suspended ceiling as is conventionally done, which reduces the load to the roof. The tiles/panels for the thermal barrier ceiling 1650 are preferably are insulated sandwich construction with a metal skin on the top side and bottom side with a thickness of 18-22 ga. which exhibit a greater mass than many conventional tiles—as here it is desired to use tiles that provide effective thermal insulation between the hot air and cold air regions. With respect to these tiles/panels, adjacent ones interlocking to provide even further strength and an air tight seal on both longitudinal seams. The section view illustrated in FIG. 1B passes through one of the frames 1607, which has two rows of cabinets associated therewith, thereby providing the cabinet cluster 1601 that has a hot aisle 1603 within a centerline thereof. The position of cabinets 1602 immediately behind the plane of the section illustration are indicated by dashed lines. Also shown are single arrows that illustrate the cool air flow from the cold air supply ducts 1610, through the electronic equipment cabinets 1602 where the air is heated as it cools the electronic equipment and then the double arrows show the hot air moving upward from the hot air containment chamber 1620 formed by the thermal shields 400 to the region between the thermal barrier ceiling 1640 and the actual ceiling 1650. Note that the thermal shields 400 bound the hot air containment chamber 1620 to form an enclosed space such that there is an air-tight seal between the top of the thermal shields and the thermal barrier ceiling 1640 to ensure all of the hot air flows into the ceiling space 1630 from where it is exhausted and that none of the hot air leaks back into the cold aisles and adjacent areas of the facility floor. Thus, the thermal shields 400 and thermal barrier ceiling 1640 form a sealed chamber or enclosed space which contains the hot air as the hot air flows upward to the ceiling space 1630. The hot air flows within the ceiling area 1630 to an exhaust channel area from where the hot air may be either exhausted outside the building, chilled and then recirculated, or a combination of external exhaust and recirculation, as described in U.S. Utility application Ser. No. 12/384,109 mentioned previously.

Though the arrows for cool air in FIG. 1B are directed straight downward from the cold air supply duct 1610, the vents associated with the cold air supply duct themselves can be adjusted to allow for directional downward flow at various angles. In a preferred embodiment, each of the vents has a remote controlled actuator that allows for the offsite control of the vents, both in terms of direction and volume of air let out of each cold air supply vent. This allows precise control such that if a particular area is running hot, this can be detected (using detectors not shown), and then adjusted for by supplying more cold air directed thereto.

Furthermore, as described in detail in U.S. Utility application Ser. No. 12/384,109 mentioned previously, ladder racks 1660 and conduit holders 1670 are preferably attached to the frame 1607 for supporting various cables, wires and conduits including power spines and telecommunications wiring. The conduit holders 1670 are shown, as an example to have room for 4 conduits to run wiring or cabling therethrough. As an alternative to the conduit holders 1670, conduit clamps for conduit holding, and holding of the wires or cables within the conduits, may be used, as also described in U.S. Utility application Ser. No. 12/384,109.

Also shown in FIG. 1B are certain vertical posts and frame elements of the frame 1608 for support of the cold air supply ducts 1610 and the thermal barrier ceiling 1640. The vertical posts of the frame 1608 are preferably bolted to the floor 1605 at the lower end and provide support for the thermal barrier ceiling 1640 at the upper end. The frame 1608 include a plurality of support pillars 1608A attached to a square frame 1608B within which the cold air supply ducts 1610 are supported, as shown in FIG. 1B, as well as a thermal barrier mount 1608C on which the thermal barrier ceiling 1640 rests. The frame 1608 also includes other vertical posts that are used to support horizontal beams on which the thermal barrier ceiling 1640 preferably rests, such as horizontal beams 1608D1 and 1608D2 illustrated in FIG. 1A2, which have a vertical post at their intersection.

FIG. 2 shows the primary load-bearing elements of one of the frames 1607 and thermal shields 400 attached thereto for one cabinet cluster 1601—as also shown in FIGS. 1A2 & 1B. For ease of illustration the frame on the back side of the cabinet cluster, from the perspective of the figure, is not shown. The frame 1607 is preferably bolted to the floor 1605 by plates 1681 and provides support for the thermal shields 400 which define the hot air containment chamber 1620 which channels the hot air into the ceiling space for exhausting, as described above, as well as provides a support for the thermal barrier ceiling 1640. The frame 1607 is comprised of vertical support brackets 1682 R and 1682L (for Right and Left) and 1683 R and 1683 L and horizontal support brackets 1684-1688, with vertical support brackets 1682 R an 1682 L providing support for horizontal support brackets 1687 and 1688 as well as for the thermal barrier 1640. The thermal shields 400 are bolted to the members 1682, 1687 and 1688. Various ladder racks (shown in FIG. 1A) as well as conduit holders (1670 in FIG. 1A2) are preferably attached to vertical support brackets 1682R and 1682L, as described above with reference to FIG. 1B, preferably above the horizontal member 1685. As described above, the frame 1607 may be made of structurally sound material, such as steel with a welded construction of the various parts as described, molded plastic, or other materials. The configuration of the frame 1607 shown in FIGS. 1A1-2, 1B and 2 is only one example of a frame configuration that can support the thermal barrier, the thermal shields and the conduits while allowing the cabinets in the cabinet cluster to be moved in and out of place—and as such other configurations of the frame are envisaged which can provide the support desired in this embodiment.

FIG. 3 illustrates a perspective view (not to scale) of part of a group of movable equipment cabinets 1602, with one cabinet rolled out into the cold aisle, according to embodiments described herein. Cabinets typically have a width of 19"-24", though they can be as large as 30". If an area does not have a cabinet within it, a thermal barrier cabinet panel 1690 (shown in dotted line) the size of the cabinet removed is preferably inserted to avoid hot air from the hot-air aisle escaping back toward a cold aisle, rather than to the above hot air containment chamber 1620 and into the ceiling area 1630. The thermal barrier cabinet panel 1690 has insulating characteristics like that of the thermal shield described above. This same type of thermal barrier cabinet panel 1690 can be used if cabinets of various sizes are used, and at an end an area needs to be closed off. The group of cabinets is configured in a row between support beams 1682 and 1683 of the frame 1607, as described above with reference to FIGS. 1A2 and 2. The arrow shows the direction of movement of the cabinet in and out of the row. In a preferred embodiment, the cabinets 1602 are provided with wheels 1702 for ease of movement, which are also lockable to keep the cabinets in position, though cabinets without wheels can also be used. Although not shown in FIG. 3, the cabinets are typically comprised of a frame supporting electronics within and are covered in wire mesh on the front and the back to allow for air flow through the cabinet, with the sidewalls preferably being sealed to allow the air to flow therethrough.

Although the embodiments have been particularly described with reference to embodiments thereof, it should be readily apparent to those of ordinary skill in the art that various changes, modifications and substitutes are intended within the form and details thereof, without departing from the spirit and scope thereof. Accordingly, it will be appreciated that in numerous instances some features will be employed without a corresponding use of other features. Further, those skilled in the art will understand that variations can be made in the number and arrangement of components illustrated in the above figures.

What is claimed is:

1. An apparatus for maintaining a configuration of electronic equipment disposed in a plurality of cabinets, for supporting a thermal shield that defines a hot air containment chamber, for supporting a thermal barrier ceiling, for supporting cool air ductwork and for supporting distribution power wires and conduits, electronic equipment power wires and conduits, and communication wiring, the plurality of cabinets disposed on a floor, the floor being within an internal area of a building, the cabinets positioned into two rows forming two rows of the cabinets that are separated by a hot aisle area so that the electronic equipment disposed in the plurality of the cabinets emit heated air in a predetermined direction toward the hot aisle area between the two rows, the apparatus comprising:

thermal shields extending upward from a rear side of the two rows of the cabinets and separated by a distance generally equal to a distance between a rear side of the two rows of the cabinets, the thermal shields forming a portion of the hot air containment chamber, the hot air containment chamber defined as a space above the floor and between and above a rear side of the two rows of the cabinets, one or more partitions, the thermal shields, and the thermal barrier ceiling such that a portion of the hot air containment chamber that is between the two rows of the cabinets receives hot air from the rear side of the two rows of the cabinets and the hot air containment chamber creating an enclosed space for flow of hot air out of the hot air containment chamber to the upward direction such that the hot air containment chamber fully segregates the hot air from the cool air that enters the cabinets and that is provided from the cool air ductwork;

an interior frame structure that is independent of and not structurally tied to the plurality of cabinets, the interior frame structure including:

a first plurality of vertical support brackets disposed along each of the two rows, two or more of the vertical support brackets being disposed on the floor at one end and to assist in supporting the thermal barrier ceiling at another end, wherein one or more of the first plurality of vertical support brackets support the thermal shields on one side of the first plurality of vertical support brackets at a location above a top of the plurality of cabinets:
    a plurality of tiered ladder rack supports, one or more of the tiered ladder rack supports connected to another side of at least some of the first plurality of vertical support brackets that is opposite the one side, which establish a plurality of different tiers of ladder racks outside of the hot air containment chamber, so that at least some of the different tiers are configured to hold the electronic equipment power wires and the communication wiring outside of the hot air containment chamber and separate from the hot air emitted from the cabinets;
    a second plurality of vertical support brackets disposed in a row, substantially parallel to the two rows, two or more of the second vertical support brackets being disposed on the floor at one end and assists in supporting the thermal barrier ceiling at another end, wherein the second plurality of vertical support brackets each further support portions of the cool air ductwork; and
    a thermal barrier ceiling supported by the plurality of vertical support brackets.

2. The apparatus according to claim 1 wherein each of the first plurality of vertical support brackets each includes a pair of vertical support members, and each pair of vertical support members are connected together with at least one horizontal member, and are further connected to another pair of vertical support members with another horizontal member;
    further including a plurality of horizontal connecting members that connect together adjacent pairs of vertical support members; and
    wherein each row of the cabinets is positionable underneath one pair of vertical support members.

3. The apparatus according to claim 2 wherein each of the second plurality of vertical support brackets includes a rectangular-shaped support through which the cool air ductwork passes.

4. The apparatus according to claim 1 wherein each of the second plurality of vertical support brackets includes a rectangular-shaped support through which the cool air ductwork passes.

5. The apparatus according to claim 1 further including a plurality of ladder racks, each of the plurality of ladder racks being associated with one of the plurality of tiered ladder rack supports of the plurality of support brackets, such that each of the plurality of ladder racks is horizontally disposed above the cabinets below and provides further support for the electronic equipment power wires and the communication wiring.

6. The apparatus according to claim 1, further including a plurality of conduit holders holding a plurality of the distribution power wires and conduits, each of the plurality of conduit holders connected to another side of at least some of the first plurality of vertical support brackets that is opposite the one side, each of the plurality of conduit holder disposed above the plurality of tiered ladder rack supports, each of the plurality of conduit holders being aligned with other ones of the plurality of conduit holders.

7. The apparatus according to claim 6 wherein the plurality of conduit holders are a plurality of conduit clamps disposed on each of the first plurality of vertical support brackets above the plurality of tiered ladder rack supports.

8. The apparatus according to claim 6 wherein the plurality of conduit holders are disposed on at least one conduit ladder rack support.

9. The apparatus according to claim 6 wherein the plurality of conduit holders are disposed on a plurality of tiered conduit ladder rack supports.

10. A method of configuring a plurality of cabinets having electronic equipment stored therein in building having exterior walls and cool air ductwork comprising the steps of:
    providing a building have exterior walls, a floor, a roof with a ceiling below the roof, and an interior room below the ceiling;
    providing a thermal barrier ceiling below the ceiling;
    within the interior room of the building, providing an interior frame structure that is independent of and not structurally tied to the plurality of cabinets, the interior frame structure including:
        a first plurality of vertical support brackets disposed along each of two rows of cabinets, each vertical support bracket being disposed on the floor at a first end, some of the vertical brackets assisting in supporting (1) a portion of a thermal barrier ceiling, the thermal barrier ceiling supported by an end of the vertical support brackets that are opposite the first end, the thermal barrier ceiling being disposed below the ceiling and creating an airspace between the ceiling and the thermal barrier ceiling, and (2) a hot containment chamber, the hot containment chamber being contiguous with the thermal barrier ceiling and providing an airflow opening from a hot air aisle into the airspace, thereby establishing a sealed chamber through which warm air rises within a hot air aisle into the hot containment chamber and then into the airspace between the ceiling and the thermal barrier ceiling; and
        a second plurality of vertical support brackets disposed substantially parallel to the two rows of cabinets, each second vertical support bracket being disposed on the floor at a first end and assists in supporting another portion of the thermal barrier ceiling at an end opposite the first end, wherein the second plurality of vertical support brackets each further support portions of the cool air ductwork below the thermal barrier ceiling, the cool air duct work having vents configured to provide cool air to the cabinets, the cool air segregated from the hot air in the hot aisle, the hot containment chamber, and the airspace;
    providing the plurality of cabinets arranged as the two rows of cabinets, namely a first row of cabinets and a second row of cabinets, the first row of cabinets and the second row of cabinets having a back side configured to emit hot air into the hot aisle and the first row of cabinets and the second row of cabinets separated by a distance to form the hot aisle between the two rows of cabinets;
    providing thermal cabinet panels in an opening within the two rows of cabinets where the plurality of cabinets are disposed to seal the hot aisle; and
    providing a thermal partition at each of two ends of the two rows to further seal the hot aisle.

11. The method according to claim 10 further including the steps of:
    removing one of the cabinets within the two rows of cabinets, thereby creating a cabinet opening within the two rows; and
    replacing the removed cabinet with another thermal cabinet panel to fill the cabinet opening.

12. The method according to claim 10 wherein the step of providing the interior frame structure includes providing a plurality of ladder racks and a plurality of conduits at locations that are on an opposite side of some of the vertical support brackets that hold the portions of the thermal shield thereby establishing the ladder racks in cool air and not in the hot air; and wherein telecommunications wiring and power wiring are disposed within the plurality of ladder racks and the plurality of conduits, adjacent to the thermal shield.

* * * * *